(12) United States Patent
Ren et al.

(10) Patent No.: US 10,271,439 B2
(45) Date of Patent: Apr. 23, 2019

(54) CLOSED TYPE DISPLAY APPARATUS AND METHOD OF ASSEMBLING THE SAME

(71) Applicant: BOE TECHNOLOGY GROUP CO., LTD., Beijing (CN)

(72) Inventors: Yan Ren, Beijing (CN); Lei Cao, Beijing (CN); Nannan Hu, Beijing (CN); Zifeng Wang, Beijing (CN); She Lin, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/646,982

(22) Filed: Jul. 11, 2017

(65) Prior Publication Data

US 2018/0042126 A1   Feb. 8, 2018

(30) Foreign Application Priority Data

Aug. 5, 2016 (CN) .......................... 2016 1 0638782

(51) Int. Cl.
| | |
|---|---|
| *H05K 7/20* | (2006.01) |
| *H05K 5/00* | (2006.01) |
| *H05K 5/03* | (2006.01) |
| *H05K 1/02* | (2006.01) |

(52) U.S. Cl.
CPC ......... *H05K 5/0017* (2013.01); *H05K 1/0203* (2013.01); *H05K 5/03* (2013.01); *H05K 7/2039* (2013.01); *H05K 7/20436* (2013.01); *H05K 7/20963* (2013.01)

(58) Field of Classification Search
CPC .............. H05K 7/202; H05K 7/20418; H05K 7/20436; H05K 7/20454; H05K 7/20463; H05K 7/2049; H05K 7/20963
See application file for complete search history.

(56) References Cited

U.S. PATENT DOCUMENTS

| | | | | |
|---|---|---|---|---|
| 5,086,509 A | * | 2/1992 | Inubushi ............. | H01M 2/1022 361/704 |
| 5,991,155 A | * | 11/1999 | Kobayashi .......... | H01L 23/3672 165/80.2 |
| 6,833,674 B2 | * | 12/2004 | Kaneko ............. | H05K 7/20972 313/11 |
| 7,164,586 B2 | * | 1/2007 | Lin ..................... | H05K 7/20972 348/794 |
| 7,242,585 B2 | * | 7/2007 | Fukuma ................ | G06F 1/1616 257/713 |
| 7,489,507 B2 | * | 2/2009 | Karashima ............ | G06F 1/1616 16/221 |
| 7,776,295 B2 | * | 8/2010 | Konigorski ............... | B64B 1/20 244/2 |

(Continued)

*Primary Examiner* — Robert J Hoffberg
(74) *Attorney, Agent, or Firm* — Kinney & Lange, P.A.

(57) ABSTRACT

The present disclosure relates to a closed type display apparatus. In an embodiment, the closed type display apparatus includes a front housing, a rear housing, and a closed space which is defined by the front housing and the rear housing and in which first and second circuit boards used in the display apparatus are disposed; wherein, a metal cover is formed as at least a portion of the rear housing, and a higher heating device of the first circuit board is disposed to be adjacent to the metal cover. The present disclosure also relates to a method of assembling a closed type display apparatus.

19 Claims, 4 Drawing Sheets

(56) References Cited

U.S. PATENT DOCUMENTS

| | | | | |
|---|---|---|---|---|
| 7,995,344 | B2* | 8/2011 | Dando, III | H05K 7/20454 165/104.33 |
| 8,081,438 | B2* | 12/2011 | Karashima | G06F 1/1616 16/221 |
| 8,081,439 | B2* | 12/2011 | Karashima | G06F 1/1616 16/221 |
| 8,363,407 | B2* | 1/2013 | Yamamoto | G06F 1/1616 165/80.2 |
| 8,501,048 | B2* | 8/2013 | Ueno | C22C 32/0084 252/502 |
| 9,214,619 | B2* | 12/2015 | Bai | H01L 35/325 |
| 2009/0057004 | A1* | 3/2009 | Watanabe | G06F 1/20 174/383 |

* cited by examiner

CLOSED TYPE DISPLAY APPARATUS AND METHOD OF ASSEMBLING THE SAME

CROSS-REFERENCE TO RELATED APPLICATION

This application claims priority to Chinese Patent Application No. 201610638782.0 filed on Aug. 5, 2016 in the State Intellectual Property Office of China, the disclosures of which are hereby incorporated by reference in their entirety.

TECHNICAL FIELD

The present disclosure relates to the technical field of display, and particularly, to a display apparatus and a method of assembling the same, which should meet requirements of high waterproof level and are used in special industries (such as medical treatment, scuba diving, etc.).

BACKGROUND

Applications of a display apparatus are very extensive at present. The display apparatus may be any products or parts having a display function, including a liquid crystal display panel, an electronic paper, a mobile phone, a tablet computer, TV, a display, a notebook computer, a digital frame, a navigator and the like.

SUMMARY

According to an aspect of the present disclosure, there provides a closed type display apparatus, comprising: a front housing; a rear housing; and a closed space which is defined by the front housing and the rear housing and in which first and second circuit boards used in the display apparatus are disposed; wherein, a metal cover is formed as at least a portion of the rear housing, and a higher heating device of the first circuit board is disposed to be adjacent to the metal cover.

In an exemplary embodiment, the metal cover is disposed at an outer side of the rear housing body, and, a radiating chamber in which the higher heating device is disposed is defined by the metal cover and the rear housing body.

In an exemplary embodiment, lower heating device and the second circuit board carried with the lower heating device are disposed in a main chamber defined by the front housing and the rear housing body.

In an exemplary embodiment, the closed type display apparatus further comprises a cooling fin disposed between the higher heating device and the metal cover and configured to transfer heat from the higher heating device to the metal cover.

In an exemplary embodiment, the cooling fin extends generally along an inner side surface of the metal cover, a side of the cooling fin substantially fits in with the inner side surface of the metal cover, and at least a portion of an opposing side of the cooling fin is against the higher heating device to form a thermal contact.

In an exemplary embodiment, a resilient thermal conductive element is disposed on at least one side of the cooling fin, and is configured to strengthen the thermal contact formed among the higher heating device, the cooling fin and the metal cover.

In an exemplary embodiment, a projection towards the higher heating device is formed at a location of the cooling fin corresponding to the higher heating device of the first circuit board.

In an exemplary embodiment, a recess is formed at a location of the cooling fin corresponding to the projection but at a side of the cooling fin facing away from the higher heating device, and the resilient thermal conductive element is embedded in the recess.

In an exemplary embodiment, the resilient thermal conductive element comprises a thermal conductive silica gel pad.

In an exemplary embodiment, the side of the cooling fin facing the metal cover is coated with a thermal conductive adhesive.

In an exemplary embodiment, the cooling fin is made of a mixture of metal material including copper, aluminum and the like, and graphite.

In an exemplary embodiment, a thermoelectric generator is disposed on an outer side surface of the metal cover.

In an exemplary embodiment, the metal cover is hermetically embedded in the rear housing body.

In an exemplary embodiment, the rear housing body is made of plastic material and/or the front housing is made of plastic material.

According to another aspect of the present disclosure, there provides a method of assembling a closed type display apparatus, the method comprising the following steps of:

a) providing a front housing and a rear housing body of the display apparatus;

b) disposing a first circuit board carried with a higher heating device on an outer side of the rear housing body;

c) assembling a metal cover onto the outer side of the rear housing body, to form a rear housing so that the first circuit board carried with the higher heating device is disposed in a radiating chamber defined by the rear housing body and the metal cover; and d) assembling the front housing with the rear housing, to form the closed type display apparatus.

In an exemplary embodiment, a second circuit board carried with a lower heating device is disposed between the front housing and the rear housing body.

In an exemplary embodiment, the method further comprises: before the step of c), disposing a cooling fin so that the cooling fin is between the higher heating device and the metal cover when the metal cover is assembled onto the rear housing body, wherein, a side of the cooling fin substantially fits in with an inner side surface of the metal cover, and at least a portion of an opposing side of the cooling fin is against the higher heating device to form a thermal contact.

In an exemplary embodiment, the cooling fin is formed with a concave-convex structure, and a projection of the cooling fin abuts against the higher heating device.

In an exemplary embodiment, a resilient thermal conductive element, for example, a thermal conductive silica gel pad, is embedded in a recess which corresponds to the projection but is at a side of the cooling fin facing away from the higher heating device.

In an exemplary embodiment, the side of the cooling fin facing the metal cover is coated with a thermal conductive adhesive.

BRIEF DESCRIPTION OF THE DRAWINGS

These and/or other aspects and advantages of embodiments of the present disclosure will become apparent and more readily appreciated from the following description of the embodiments, taken in conjunction with the accompanying drawings of which.

DETAILED DESCRIPTION OF THE EMBODIMENTS

Figure 1A:
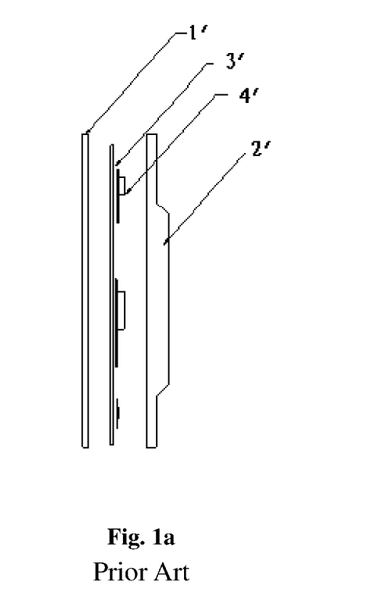
FIG. 1a and FIG. 1b show an exploded schematic view and a rear view of a display apparatus, respectively.
Figure 1B:
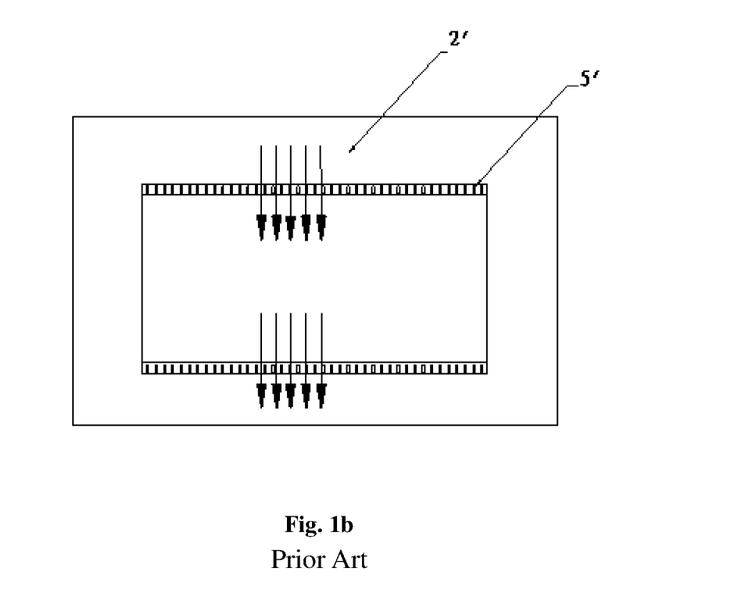

Referring to FIG. 1a and FIG. 1b, a display apparatus comprises a front housing 1', a rear housing 2', a module 3' disposed in a chamber defined by the front housing 1' and the rear housing 2', and circuit boards 4' (for example, including a power supply board, a SOC board, a FPGA board, a backlight driver board, a screen driver board and the like) disposed on the module 3'. The front housing 1' and the rear housing 2' are made of plastic material. When the display apparatus operates, electronic devices on the circuit boards 4' generate thermal power consumption and release heat. Heat is accumulated in the chamber where the module is disposed, which leads to a rapid rise in temperature. In conventional display apparatus, ventilation holes 5' are formed in the rear housing. Generally, the ventilation holes 5' are distributed in an array at both upper region and lower region of the rear housing, to serve as passages for air circulation between interior and exterior of the chamber, so that external cold air is allowed to enter the interior of the chamber and cool down the heating electronic devices, and then to discharge the heated air to ambient environment through these ventilation holes.

Provision of the ventilation holes ensures lowering of temperature inside the display apparatus and normal operations of these components of the display apparatus, however, it limits scope of application of the display apparatus, especially applications on special industries such as medical purposes, scuba diving, etc. For example, in a medical application, specifically, a medical monitor used in an operating room, there encounters an extremely high waterproof requirement (of IPX5 waterproof level). In addition, in sanitation, it is also required to meet the requirements of windproof, dust prevention and even noise abatement. This necessarily requires that the housing of the display apparatus is closed, without provision of any ventilation holes or openings to the external.

If the ventilation holes in the rear housing of the conventional display apparatus are blocked off, it is inevitable that more and more heat will be accumulated inside the chamber and the temperature will get higher and higher. Once the temperature exceeds a temperature threshold that electronic device can withstand, the display apparatus will fail. Also, operation of the display apparatus in a high temperature environment for a long time will greatly reduce the life of the display apparatus.

Therefore, the present disclosure aims to overcome one or more of the abovementioned problems.

Embodiments of the present disclosure will be described hereinafter in detail with reference to the attached drawings, wherein the like or similar reference numerals in the attached drawings refer to the like or similar elements.

Figure 2A:
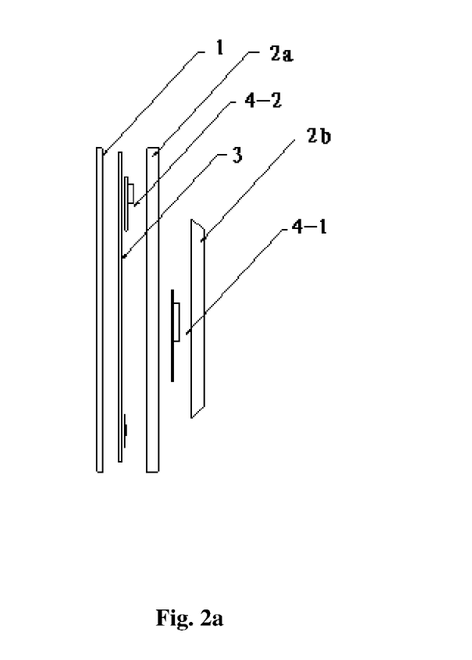
FIG. 2a and FIG. 2b show an exploded schematic view and a rear view of a display apparatus according to an exemplary embodiment of the disclosure, respectively.
Figure 2B:
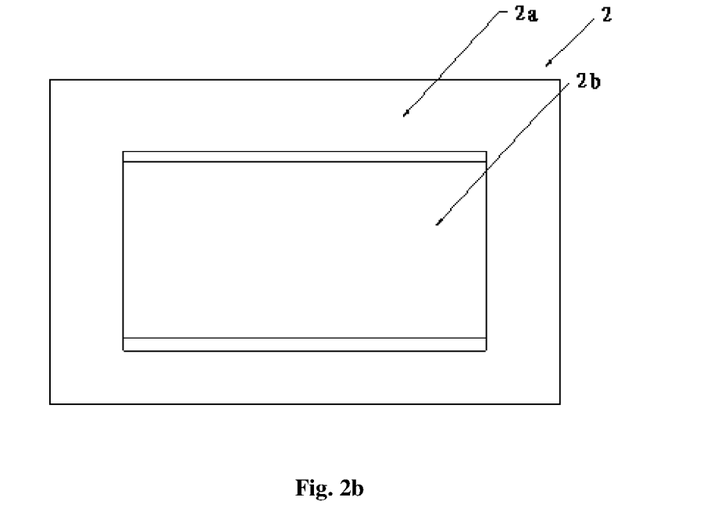

Referring to FIG. 2a and FIG. 2b, according to an embodiment of the present disclosure, there provides a display apparatus. The display apparatus comprises a front housing 1, a rear housing body 2a, and a module 3 disposed between the front housing 1 and the rear housing body 2a. A metal cover 2b is disposed at an outer side of the rear housing body 2a. The rear housing body 2a and the metal cover 2b are assembled into a rear housing 2 of the display apparatus.

The cover made of metal material is capable of rapidly transferring the heat generated by the higher heating device disposed adjacent thereto out of the housing, avoiding accumulation of the heat in the closed space inside the display apparatus.

It should be noted that, herein, "a/the front housing" indicates a housing portion at a side of the display apparatus where is usually viewed by a user, while "a/the rear housing" indicates a housing portion at a side of the display apparatus facing away from the user. In this description, the front housing and the rear housing are described as independent parts separated from each other, however, in a totally closed display apparatus, the front housing and the rear housing may be a front portion and a rear portion of an integral housing of the display apparatus.

In an exemplary embodiment, periphery of the metal cover 2b is hermetically embedded in the rear housing body 2a. Thereby, a radiating chamber is defined by the rear housing body 2a and the metal cover 2b. In the display apparatus, high thermal power consumption circuit board 4-1, such as a power supply board and a FPGA board, are disposed nearby the metal cover 2b and, for example, are disposed within the radiating chamber such that heat released from the higher heating device on the circuit board is transferred to the metal cover and then is dissipated to ambient environment via the metal cover. With this configuration, heat generated by higher heating device are concentrated near the metal cover, to facilitate transference of the heat from the display apparatus by virtue of a large temperature difference between inner side and outer side of the metal cover.

Referring to FIG. 2a, as to the circuit boards used in the display apparatus, the high thermal power consumption circuit board 4-1 and other low thermal power consumption circuit board 4-2 are disposed to be separated from each other. Specifically, the high thermal power consumption circuit board 4-1 is disposed in the radiating chamber defined by the rear housing body 2a and the metal cover 2b, while the low thermal power consumption circuit board 4-2 and the module 3 are disposed in a main chamber defined by the front housing 1 and the rear housing body 2a, so that, in the main chamber where the low thermal power consumption circuit board 4-2 are disposed the temperature is not so high, while, the higher heating device of the high thermal power consumption circuit board 4-1 in the radiating chamber transfers the heat via the metal cover, thereby, rising of the temperature in the radiating chamber will not affect operations of the other low thermal power consumption circuit boards. That is, temperature sensitive or lower heating device and higher heating device are provided in different chambers, respectively, which ensures normal operations of the components of the display apparatus and facilitates transference of the heat and thus further improves heat dissipation efficiency.

Figure 3:
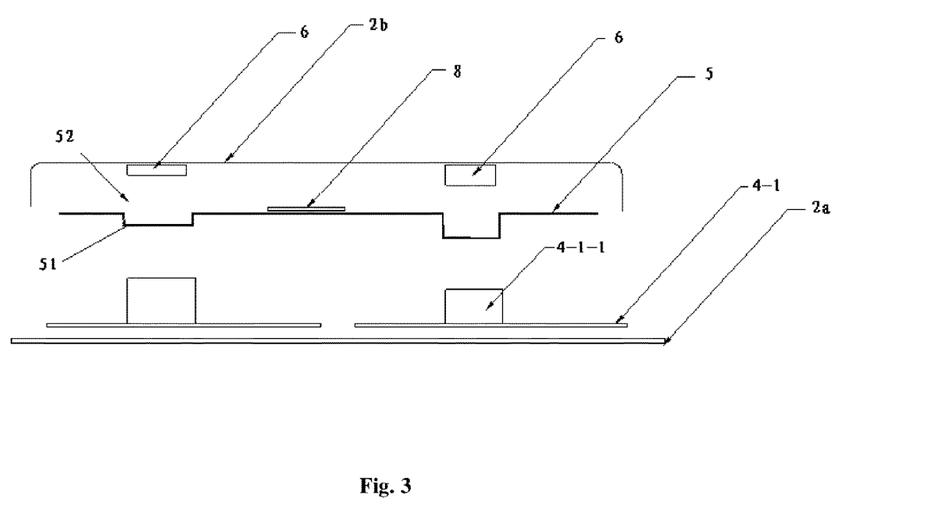
FIG. 3 shows an exploded schematic view of a rear housing of a display apparatus according to another exemplary embodiment of the disclosure.

Referring to FIG. 3, in order to strengthen transference of the heat from interior to exterior of the radiating chamber, a cooling fin 5 is disposed between the higher heating device 4-1-1 (for example, a main chip on the circuit board) of the high thermal power consumption circuit board 4-1 and the metal cover 2b. Compared with the air serving as a heat-transfer medium between the higher heating device and the metal cover, the cooling fin is provided to offer a more effective heat transferring passage and thus the heat dissipation effect is significantly enhanced. The cooling fin 5 extends substantially along an inner side surface of the metal cover 2b. When the display apparatus is assembled, a side of the cooling fin 5 fits in with the inner side surface of the metal cover 2b, and at least a portion of an opposing side of the cooling fin is against the higher heating device 4-1-1 to form a thermal contact. As a result, a radiating area is increased and the heat dissipation effect is enhanced. In an embodiment, a resilient thermal conductive element 6 is disposed on at least one side of the cooling fin, to facilitate and strengthen the thermal contact formed among the higher heating device 4-1-1, the cooling fin 5 and the metal cover 2b. Provision of the resilient thermal conductive element 6 can compensate for assembly error of the display apparatus, and thus ensure the thermal contact formed among the higher heating device, the cooling fin and the metal cover. For example, the resilient thermal conductive element 6 is a thermal conductive silica gel pad. In the embodiment shown in FIG. 3, the cooling fin 5 is formed with a concave-convex structure. The concave-convex structure is formed by for example bending or pressing the cooling fin 5. Accordingly, in a situation where the cooling fin 5 is formed with a concave-convex structure by a bending process, at least one projection 51 is formed on a side of the cooling fin 5, correspondingly, a recess 52 is formed at a location of the cooling fin corresponding to the projection but at an opposing side of the cooling fin. For example, the projection 51 is formed at a location of the cooling fin corresponding to the higher heating device 4-1-1 of the high thermal power consumption circuit board 4-1 and is towards the higher heating device 4-1-1. The projection 51 has a contact surface that abuts against the higher heating device. The projection 51 shown in this Figure has a substantially flat contact surface, however, those skilled in the art may easily envisage designing the contact surface to have any shape that is complementary to at least a portion of outer surface of the higher heating device. Usually, more than one higher heating device is on the circuit board, and heights of these higher heating devices from the circuit board are different. In order to transfer much more heat from the more than one higher heating device, projections are formed at locations of the cooling fin corresponding to the higher heating devices. When the display apparatus is assembled, the projections abut right against the higher heating devices. In an example, the projection is designed to have a surface of which the shape matches outer surface of the higher heating device.

Figure 4:
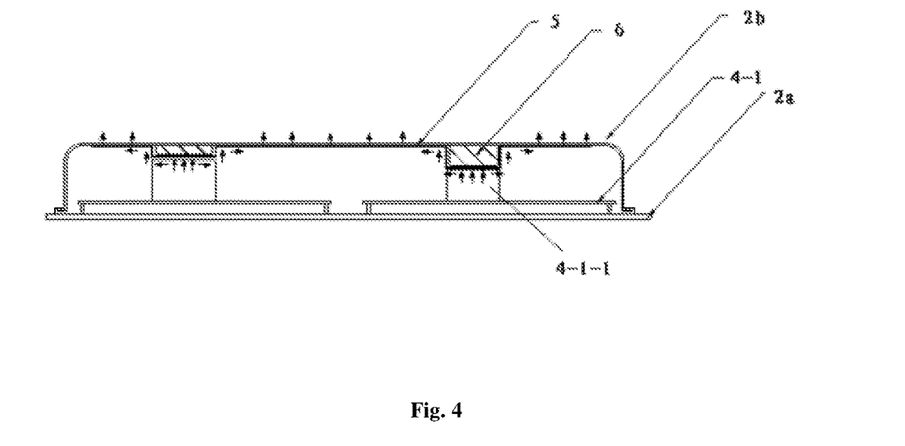
FIG. 4 is a schematic view showing heat transference in an internal space of the rear housing of the display apparatus according to the another exemplary embodiment of the disclosure.

In the embodiment shown in FIG. 3 and FIG. 4, at a location of the metal cover 2b corresponding to the higher heating device 4-1-1 of the circuit board (namely, at a location of the cooling fin corresponding to the projection but at a side of the cooling fin facing away from the higher heating device), a thermal conductive silica gel pad serving as the resilient thermal conductive element 6 is attached. Thickness of the thermal conductive silica gel pad corresponds to depth of the recess. For example, the thickness of the thermal conductive silica gel pad may be slightly greater than a distance between the higher heating device and the metal cover. In this way, when the metal cover is assembled onto the rear housing body, there has an interference fit which, together with resiliency of the thermal conductive silica gel pad itself, allows the cooling fin to be pressed against the higher heating device, so that the contact surface of the projection of the cooling fin is closely against the outer surface of the higher heating device to form a thermal contact.

As shown in FIG. 4, when the display apparatus operates, heat is transferred from the higher heating device 4-1-1 along a direction indicated the arrow, that is to say, the heat is transferred from the higher heating device 4-1-1 to the cooling fin 5, and then is transferred to the metal cover 2b from the cooling fin 5, and finally is dissipated to ambient environment via the metal cover 2b. This is a heat transferring passage from the higher heating device to the metal cover. Meanwhile, due to thermal conductivity of the thermal conductive silica gel pad serving as the resilient thermal conductive element 6, some of the heat generated by the higher heating device 4-1-1 is transferred from the cooling fin 5 to the metal cover 2b via the thermal conductive silica gel pad, accordingly, the thermal conductive silica gel pad serving as the resilient thermal conductive element 6 also defines another heat transferring passage from the higher heating device to the metal cover.

In an example, the side of the cooling fin 5 facing the metal cover 2b is coated with a thermal conductive adhesive 8. Thereby, when the metal cover is assembled onto the rear housing body, the cooling fin 5 closely fits in with the inner side surface of the metal cover 2b, which easily strengthens transference of the heat from the cooling fin to the metal cover.

In an exemplary embodiment, the cooling fin 5 is made of a mixture of metal material (for example, copper, aluminum) and graphite. The mixture has a thermal conductivity of about 320 W/(m·K) in its extension direction. With the heat-transfer characteristic of the cooling fin in the extension direction, an effectively radiating area is expanded from the contact surface of the projection to entire surface of the cooling fin fitting in with the inner side surface of the metal cover. Accordingly, the radiating area is greatly increased, which improves radiating speed and enhances radiating effect.

Generally, the rear housing body of the display apparatus is made of plastic material and/or the front housing is made of plastic material. Thereby, configuration and production line for manufacturing the conventional display apparatus are retained, which reduces manufacturing cost and transformation cost of the display apparatus.

In the abovementioned embodiments where the metal cover 2b is embedded in the rear housing body 2a, however, those skilled in the art may easily envisage designing the metal cover as an independent cover-shaped component which can be hermetically assembled to the rear housing body. Thereby, transformation to the conventional display apparatus is easy, since it is only to add the metal cover and some necessarily connection holes to a rear housing of a conventional display apparatus.

Figure 5:
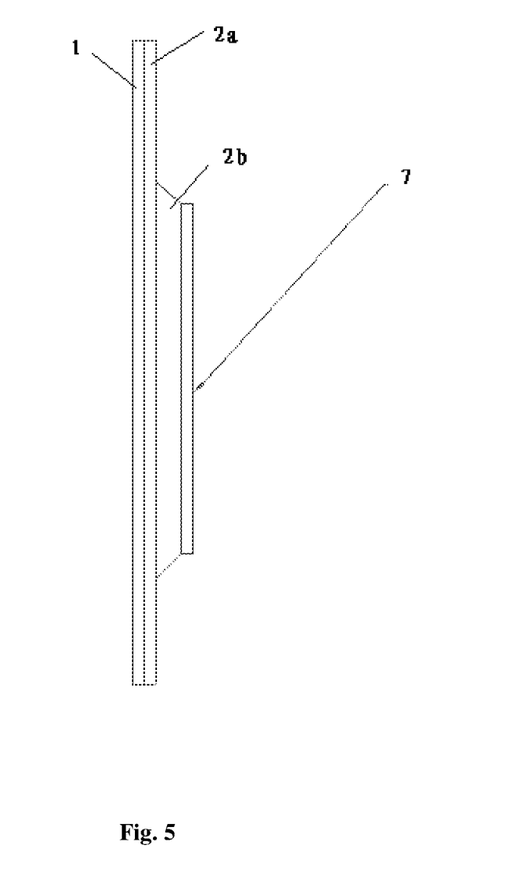
FIG. 5 shows a side view of a display apparatus according to yet another exemplary embodiment of the disclosure, in which a thermoelectric generator is attached to an outer side of a metal cover of a rear housing.

Referring to FIG. 5 which shows an assembled display apparatus, a thermoelectric generator 7 having a sheet shape is disposed on a surface of the metal cover 2b away from the rear housing body 2a. Thereby, a thermoelectric generation is implemented using thermal potential difference between the metal cover 2b and ambient environment. For example, the electrical power generated by the thermoelectric generator 7 may be supplied to attachments of the display apparatus, such as small-sized electronic appliances including loudspeaker and the like. In this way, not only the radiating speed is increased, but also energy is sufficiently used, so as to save energy.

The thermoelectric generator 7 may be formed by connecting N type and P type semiconductor thermoelectric materials in series with a flow conducting sheet having good electrical conductivity. Once a hot end of the thermoelectric generator 7 is heated, there creates a temperature difference between both ends of the thermoelectric generator 7, charge carriers of the two types are flowed to a cold end, which achieve an electrical generation based on Seebeck effect. Common commercial thermoelectric device contains 18 to 128 sets of thermoelectric units connected repeatedly in series or in parallel, to achieve required power. The thermoelectric generation has incomparable advantages of safe and reliable, long in service life, and low in maintenance cost, and no noise, compared with other types of electrical generation.

In addition, herein, terminology "inner side" indicates an inner space of the display apparatus or a direction towards the inner space, while, "outer side" indicates an outer space of the display apparatus or a direction towards the outer space. "Closed type display apparatus" indicates the housing of the display apparatus defines a closed space therein, without any openings or holes communicating interior of the display apparatus with ambient environment.

A method of assembling the display apparatus according to embodiments of the present disclosure is illustrated and described hereafter.

Referring to FIG. 3, the method comprises the steps of: providing a front housing 1 and a rear housing body 2a of the display apparatus; disposing a high thermal power consumption circuit board 4-1 carried with a higher heating device 4-1-1 on an outer side of the rear housing body 2a; assembling a metal cover 2b onto the outer side of the rear housing body 2a, to form a rear housing 2 so that the high thermal power consumption circuit board 4-1 carried with the higher heating device 4-1-1 is disposed in a radiating chamber defined by the rear housing body 2a and the metal cover 2b; and, assembling the front housing 1 with the rear housing 2, to form the closed type display apparatus.

In accordance with the assembling method according to embodiments of the present disclosure, basic configuration of conventional display apparatus is generally retained. In addition, the step of assembling the metal cover is simple and easy, which will not excessively adds manufacturing cost.

Before assembling the front housing 1 with the rear housing 2 of display apparatus, a low thermal power consumption circuit board 4-2 carried with a lower heating device which generates little of heat when operating is disposed between the front housing and the rear housing body. By adopting the space separation manner, the higher heating device is effectively isolated to avoid an influence of the higher heating device on other electronic devices, which improves working stability of the display apparatus.

In an exemplary embodiment, before the step of assembling the metal cover, a cooling fin is disposed near the higher heating device so that the cooling fin is between the higher heating device and the metal cover when the metal cover is assembled onto the rear housing body, wherein, a side of the cooling fin substantially fits in with an inner side surface of the metal cover, and at least a portion of an opposing side surface of the cooling fin is against the higher heating device to form a thermal contact. Optionally, the cooling fin is formed with a concave-convex structure, and a projection of the cooling fin abuts against the higher heating device. Also optionally, a resilient thermal conductive element such as a thermal conductive silica gel pad is embedded in a recess which corresponds to the projection but is formed at a side of the cooling fin facing away from the higher heating device.

In an exemplary embodiment, before the step of assembling the metal cover, a side of the cooling fin facing the metal cover is coated with a thermal conductive adhesive.

The closed type display apparatus and the method of assembling the closed type display apparatus according to the embodiments of the present disclosure not only meet requirements of waterproof, windproof and dustproof in special industries, but also meet the radiating demands, which ensures working stability and reliability of the display apparatus. In addition, the assembling is simple, and the manufacture cost and the transformation cost are low. Especially, the cooling fin used adopts a radiating mode in the extension direction. Compared with conventional heat-transfer mode in which the heat from the heating devices is dissipated by the air, according to the present disclosure, the heat from the heating device is firstly transferred to the cooling fin and then is dispersed rapidly in whole cooling fin. With the surface of the cooling fin fitting in with the metal cover, the heat is rapidly transferred to the outer side of the cover metal and finally is dissipated to ambient environment. Use of this radiating structure can greatly expand the radiating area and significantly enhance the radiating effect.

The above merely are exemplary embodiments of the closed type display apparatus and the method of assembling the closed type display apparatus according to the present disclosure. This radiating structure is not limited to specific embodiment illustrated and described herein.

The above embodiments are only examples of the present disclosure, but the scope of the present disclosure is not limited to this. It will be apparent for those skilled in the art that some changes and modifications on these embodiments may be made without departing from the principles and spirit of the present disclosure, the scope of which is defined in the claims and their equivalents.

What is claimed is:

1. A closed type display apparatus, comprising:
   a front housing;
   a rear housing; and
   a closed space which is defined by the front housing and the rear housing and in which first and second circuit boards used in the display apparatus are disposed;
   wherein, the rear housing comprises a rear housing body and a metal cover, the metal cover is formed as at least a portion of the rear housing, a first heating device of the first circuit board is disposed to be adjacent to the metal cover, and a periphery of the metal cover is hermetically embedded in the rear housing body.

2. The closed type display apparatus of claim 1, wherein, the metal cover is disposed at an outer side of the rear housing body, and, a radiating chamber in which the first heating device is disposed is defined by the metal cover and the rear housing body.

3. The closed type display apparatus of claim 2, wherein, a second heating device and the second circuit board carried with the second heating device are disposed in a main chamber defined by the front housing and the rear housing body.

4. The closed type display apparatus of claim 2, wherein, the rear housing body is made of a plastic material and/or the front housing is made of a plastic material.

5. The closed type display apparatus of claim 1, further comprising a cooling fin disposed between the first heating device and the metal cover and configured to transfer heat from the first heating device to the metal cover.

6. The closed type display apparatus of claim 5, wherein, the cooling fin extends along an inner side surface of the metal cover, a side of the cooling fin fits in with the inner side surface of the metal cover, and at least a portion of an opposing side of the cooling fin is against the first heating device to form a thermal contact.

7. The closed type display apparatus of claim 6, wherein, a resilient thermal conductive element is disposed on at least one of the side or the opposing side of the cooling fin, and is configured to strengthen the thermal contact formed among the higher first heating device, the cooling fin and the metal cover.

8. The closed type display apparatus of claim 7, wherein, a projection towards the first heating device is formed at a location of the cooling fin corresponding to the first heating device of the first circuit board.

9. The closed type display apparatus of claim 8, wherein, a recess is formed at a location of the cooling fin corresponding to the projection but at the side of the cooling fin facing the metal cover, and the resilient thermal conductive element is embedded in the recess.

10. The closed type display apparatus of claim 9, wherein, the resilient thermal conductive element comprises a thermal conductive silica gel pad.

11. The closed type display apparatus of claim 6, wherein, the side of the cooling fin facing the metal cover is coated with a thermal conductive adhesive.

12. The closed type display apparatus of claim 6, wherein, the cooling fin is made of a mixture of metal material and graphite.

13. The closed type display apparatus of claim 1, wherein, a thermoelectric generator is disposed on an outer side surface of the metal cover.

14. A method of assembling a closed type display apparatus, the method comprising steps of:

a) providing a front housing and a rear housing body of the display apparatus;
b) disposing a first circuit board carried with a higher first heating device on an outer side of the rear housing body;
c) assembling a metal cover onto the outer side of the rear housing body by hermetically embedding a periphery of the metal cover into the rear housing body to form a rear housing so that the first circuit board carried with the higher first heating device is disposed in a radiating chamber defined by the rear housing body and the metal cover; and
d) assembling the front housing with the rear housing to form a closed space, so as to form the closed type display apparatus.

15. The method of claim 14, wherein, a second circuit board carried with a second heating device is disposed between the front housing and the rear housing body.

16. The method of claim 14, further comprising: before the step c), disposing a cooling fin so that the cooling fin is between the first heating device and the metal cover when the metal cover is assembled onto the rear housing body, wherein, a side of the cooling fin fits in with an inner side surface of the metal cover, and at least a portion of an opposing side of the cooling fin is against the higher heating device to form a thermal contact.

17. The method of claim 16, wherein, the cooling fin is formed with a concave-convex structure, and a projection of the cooling fin abuts against the first heating device.

18. The method of claim 17, wherein, a resilient thermal conductive element is embedded in a recess which corresponds to the projection but is formed at the side of the cooling fin facing the metal cover.

19. The method of claim 16, wherein, the side of the cooling fin facing the metal cover is coated with a thermal conductive adhesive.

* * * * *